United States Patent [19]
Furuya et al.

[11] Patent Number: 5,640,090
[45] Date of Patent: Jun. 17, 1997

[54] SENSOR IC

[75] Inventors: Misao Furuya; Hirohiko Urushiyama; Atsushi Watanabe; Katsuaki Yano, all of Atsugi, Japan

[73] Assignee: Mitsumi Electric Company, Ltd., Tokyo, Japan

[21] Appl. No.: 580,379

[22] Filed: Dec. 28, 1995

[30] Foreign Application Priority Data

Jan. 31, 1995 [JP] Japan ................. 7-014107

[51] Int. Cl.$^6$ ................. G01R 33/07; G01L 1/04
[52] U.S. Cl. ................. 324/251; 73/862.473
[58] Field of Search ................. 324/207.2, 207.12, 324/225, 251; 338/32 H; 327/511, 510; 73/862.381, 862.473, 862.581, 862.391

[56] References Cited

U.S. PATENT DOCUMENTS

| | | | |
|---|---|---|---|
| 4,011,469 | 3/1977 | Chapron | 327/511 |
| 4,074,173 | 2/1978 | Janssen | 318/138 |
| 4,253,107 | 2/1981 | Macdougall | 357/27 |
| 4,482,255 | 11/1984 | Gygax et al. | 368/10 |
| 4,519,401 | 5/1985 | Ko et al. | 118/748 |
| 4,599,564 | 7/1986 | Kelleher et al. | 324/251 |
| 4,947,851 | 8/1990 | Sarvazyan et al. | 75/597 X |
| 5,017,804 | 5/1991 | Harnden et al. | 338/32 H |

*Primary Examiner*—Sandra L. O'Shea
*Assistant Examiner*—Roger C. Phillips
*Attorney, Agent, or Firm*—Michael N. Meller

[57] ABSTRACT

A sensor IC generates a voltage according to magnetic flux density of an applied magnetic field. The sensor IC includes a plurality of Hall sensors having an identical shape formed adjacent to each other in a semiconductor chip, each of the Hall sensors generating a sensor output voltage which includes a Hall output voltage component in proportion to the magnetic flux density. The sensor IC further includes a plurality of differential amplifiers having an identical circuit formed adjacent to each other in the semiconductor chip, each of the differential amplifiers multiplying the sensor output voltage produced from a corresponding one of the Hall sensors by a given gain. In the sensor IC, by a summing circuit, output signals produced from the plurality of differential amplifiers are summed.

3 Claims, 4 Drawing Sheets

SENSOR IC

BACKGROUND OF THE INVENTION

1. Field of the Invention

The present invention generally relates to a sensor IC, and more particularly, to a sensor IC such as a magnetic sensor IC integrated with a magnetic sensor and additional circuits, and a pressure sensor IC integrated with a pressure sensor and additional circuits.

2. Description of the Related Art

FIG. 1 shows a schematic diagram of a prior art magnetic sensor IC. The magnetic sensor IC 21 is constructed with a single Hall sensor Hs, a single differential amplifier DAV, and load resistors Rc1, Rc2, all of which are formed on the same semiconductor chip.

The Hall sensor Hs is provided with the power source voltage Vcc, and is operative with a constant voltage. A sensor output voltage produced from an output terminal of the Hall sensor Hs is given by a sum of an unbalanced voltage $V_{Hoff}$ in the Hall sensor Hs and a product ($V_{HO}.B$) of sensitivity $V_{HO}$ of the Hall sensor Hs and magnetic flux density B of a magnetic field applied to the magnetic sensor IC 21.

The sensor output voltage of the Hall sensor Hs is provided to input terminals of the differential amplifier DAV. The differential amplifier DAV is constructed with transistors Q1, Q2, a current-feedback resistor $R_E$, and constant current sources J1, J2. Output currents Ic1, Ic2 of the differential amplifier DAV are respectively converted to voltages by the load resistors Rc1, Rc2, and are produced as an output voltage Vout1 between output terminals T6, T7.

In the differential amplifier DAV, values of the load resistors Rc1, Rc2, the current-feedback resistor $R_E$, and bias currents I1, I2 generated in the current sources J1, J2 are adjusted so that a voltage gain of the differential amplifier DAY could be a value A, where Rc1=Rc2, and I1=I2.

In this case, the output voltage Vout1 of the magnetic sensor IC 21 is given by the following equation (1).

$$Vout1 = A.V_{HO}.B + A.(V_{Hoff} + V_{Aoff}) \quad (1)$$

where

A: voltage gain of the differential amplifier DAV,

VHO: sensitivity of the Hall sensor Hs,

B: magnetic flux density of a magnetic field applied to the magnetic sensor IC, $V_{Hoff}$: an unbalanced voltage in the Hall sensor Hs, and $V_{Aoff}$: an input offset voltage of the differential amplifier DAV.

In the equation (1), a first term indicates a Hall output voltage component when the magnetic flux density B is applied to the magnetic sensor IC 21. The following equation (2), which is given by dividing the first term of the equation (1) by the magnetic flux density B, indicates sensitivity K1 of the magnetic sensor IC 21.

$$K1 = A.V_{HO} \quad (2)$$

A second term of the equation (1) is given by multiplying the sum of the unbalanced voltage $V_{Hoff}$ and the input offset voltage $V_{Aoff}$ of the differential amplifier DAV by the voltage gain A of the differential amplifier DAV, and indicates an unbalanced voltage component.

In a process of manufacturing the above-discussed magnetic sensor IC, deviation of electrode size of the Hall sensor Hs, etc., may usually occur due to dispersion in a photo etching process and a diffusion process, etc. Whereby, the unbalanced voltage $V_{Hoff}$ of the Hall sensor Hs is dispersed. Further, due to the dispersion in the photo etching process and the diffusion process, etc., the input offset voltage $V_{Aoff}$ of the differential amplifier DAV is also dispersed.

In the prior art magnetic sensor IC shown in FIG. 1, an amount of dispersion of the unbalanced voltage $V_{Hoff}$ of the Hall sensor Hs and an amount of dispersion of the input offset voltage $V_{Aoff}$ of the differential amplifier DAV are respectively multiplied by the voltage gain A of the differential amplifier DAV. Therefore, the output voltage Vout1 is dispersed. Accordingly, in the prior art magnetic sensor IC, there is a problem that it is difficult to use for measuring a magnetic field with high precision.

Further, the large dispersion of the unbalanced voltage component may prevent a magnetic sensor IC of high-sensitivity from being produced.

SUMMARY OF THE INVENTION

It is an object of the present invention to provide a sensor IC which has high sensitivity. Dispersion occurring in an output voltage of the sensor IC may be reduced. This permits the disadvantages described above to be eliminated.

The object described above is achieved by a sensor IC generating a voltage according to magnetic flux density of an applied magnetic field, the sensor IC comprising: a plurality of Hall sensors having an identical shape formed adjacent to each other in a semiconductor chip, each of the Hall sensors generating a sensor output voltage which includes a Hall output voltage component in proportion to the magnetic flux density; a plurality of differential amplifiers having an identical formed adjacent to each other in the semiconductor chip, each of the differential amplifiers multiplying the sensor output voltage produced from a corresponding one of the Hall sensors by a given gain; and a summing circuit summing output signals produced from the plurality of differential amplifiers.

According to the above-discussed sensor IC, sensitivity for the magnetic flux density may be increased n times of a prior art sensor IC which is constructed with a single Hall sensor and a single differential amplifier. Further, since in a configuration of the sensor IC according to the present invention, voltages in unbalanced components occurring due to both unbalanced voltages of the Hall sensors and input offset voltages of the differential amplifiers are substantially averaged, a standard deviation of the voltage of the unbalanced components causing dispersion of the output voltage may be reduced to $1/\sqrt{n}$ of that of the prior sensor IC.

Therefore, a highly sensitive sensor IC with small dispersion of the output voltage may be constructed.

The object described above is also achieved by the sensor IC mentioned above, wherein the sensor IC further comprises a waveform-shaping circuit comparing an output voltage of the summing circuit with a reference voltage and converting a two level digital signal.

According to the above-discussed sensor IC, when the magnetic flux density of the magnetic field to be detected is larger than a given threshold level, the waveform-shaping circuit produces an output signal of a H level or a L level. Since in the sensor IC according to the present invention, the sensitivity for the magnetic flux density may be increased and the dispersion of the input voltage to the waveform-shaping circuit may be reduced, the sensor IC can determine whether the magnetic flux density is larger than the given threshold level with high sensitivity and high precision.

The object described above is also achieved by a sensor IC generating a voltage according to applied pressure, the sensor IC comprising: a plurality of semiconductor pressure sensors having an identical shape formed adjacent to each other in a semiconductor chip, each of the sensors generating a sensor output voltage which includes a detected voltage component in proportion to the applied pressure; a plurality of differential amplifiers having an identical circuit formed adjacent to each other in the semiconductor chip, each of the differential amplifiers multiplying the sensor output voltage produced from a corresponding one of the semiconductor pressure sensors by a given gain; and a summing circuit summing output signals produced from the plurality of differential amplifiers.

Further, according to the above-mentioned sensor IC, sensitivity for the applied pressure may be increased n times that of a prior art sensor IC which is constructed with a single semiconductor pressure sensor and a single differential amplifier. Further, since in a configuration of the sensor IC according to the present invention, voltages in unbalanced components occurring due to both unbalanced voltages of the semiconductor pressure sensors and input offset voltages of the differential amplifiers are substantially averaged, a standard deviation of the voltage of the unbalanced components causing dispersion of the output voltage may be reduced to $1/\sqrt{n}$ of that of a prior sensor IC.

Therefore, a high-sensitive sensor IC with small dispersion of the output voltage may be constructed.

Other objects and further features of the present invention will be apparent from the following detailed description when read in conjunction with the accompanying drawings.

DESCRIPTION OF THE PREFERRED EMBODIMENTS

Figure 2:
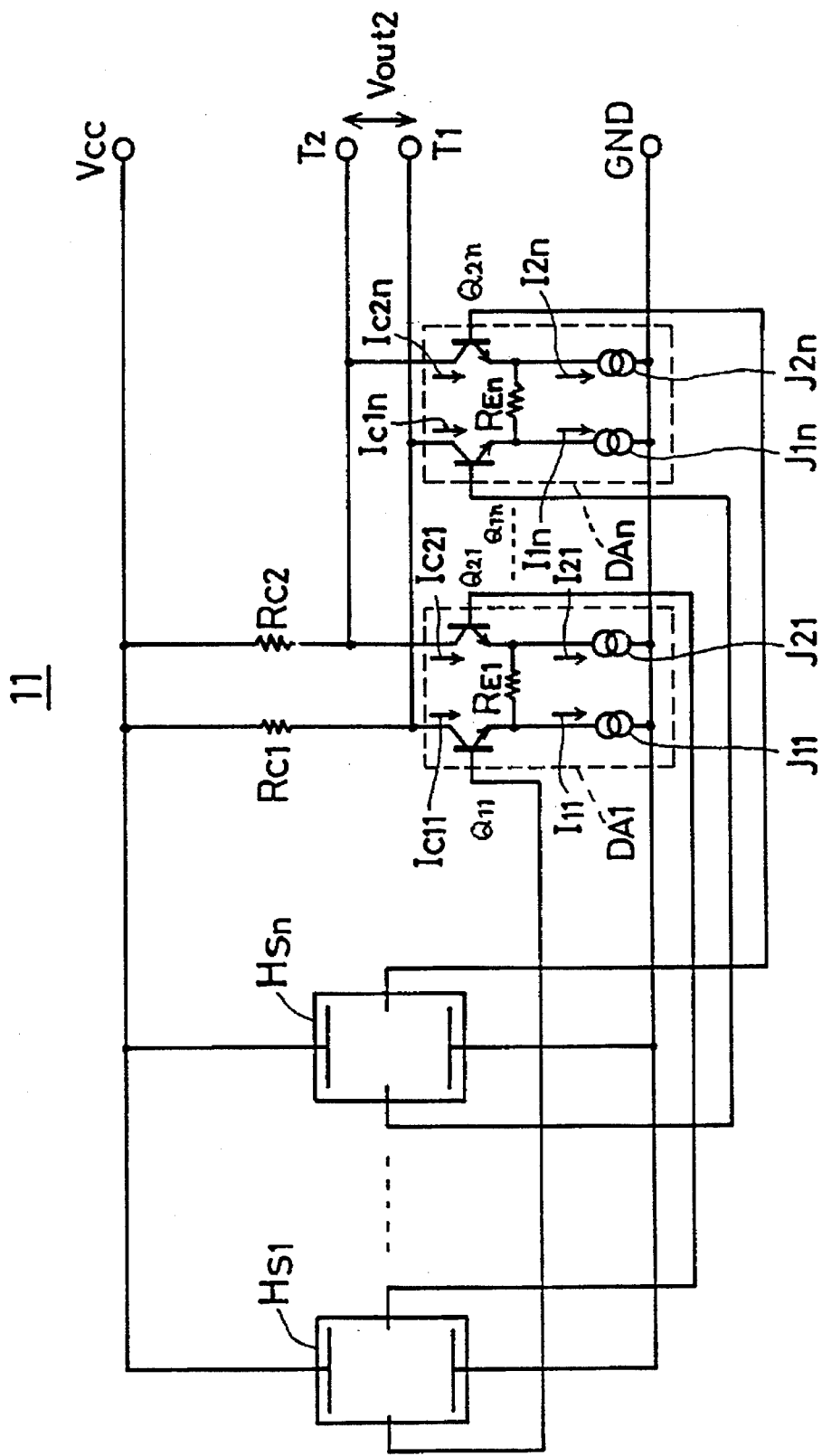
FIG. 2 shows a schematic diagram of a first embodiment of a magnetic sensor IC according to the present invention.

First, a description will be given of a first embodiment of a sensor IC according to the present invention, by referring to FIG. 2. FIG. 2 shows a schematic diagram of the first embodiment of a magnetic sensor IC according to the present invention. A magnetic sensor IC 11 shown in FIG. 2 is constructed with n Hall sensors Hs1 to Hsn, n differential amplifiers DA1 to DAn, and load resistors Rc1, Rc2 (current addition circuit), which are formed on the same semiconductor chip. The magnetic sensor IC 11 may be formed by using, for example, a silicon-bipolar process.

In the semiconductor chip of the magnetic sensor IC 11, the n Hall sensors Hs1 to Hsn having the same shape are formed close, i.e., adjacent, to each other. In the semiconductor chip, the n differential amplifiers DA1 to DAn having the same pattern and the same circuit are formed close, i.e., adjacent, to each other. Further, in the semiconductor chip, the load resistors Rc1, Rc2 having the same shape and the same value are formed close, i.e., adjacent, to each other.

The Hall sensors Hs1 to Hsn are provided with a power source voltage Vcc, and are operative with a constant voltage. A sensor output voltage produced from the Hall sensor Hs1 is given by the sum of an unbalanced voltage $V_{Hoff1}$ in the Hall sensor Hs1 and a product ($V_{HO1} \cdot B$) of sensitivity $V_{HO1}$ of the Hall sensor Hs1 and magnetic flux density B of a magnetic field applied to the magnetic sensor IC 11.

In the same way the Hall sensor Hs1, sensor output voltages produced from the Hall sensors Hs2 to Hsn are respectively given by sums of unbalanced voltages $V_{Hoff2}$ to $V_{Hoffn}$ in the Hall sensors Hs2 to Hsn and products (($V_{HO2} \cdot B$) to ($V_{HOn} \cdot B$)) of sensitivity $V_{HO2}$ to $V_{HOn}$ of the Hall sensors Hs2 to Hsn and the magnetic flux density B of the magnetic field applied to the magnetic sensor IC 11.

The sensor output voltages of the Hall sensors Hs1 to Hsn are respectively provided to input terminals of the corresponding differential amplifiers DA1 to DAn. The differential amplifier DA1 is constructed with transistors Q11, Q21, a current-feedback resistor $R_{E1}$, and constant current sources J11, J21. Each of the differential amplifiers DA2 to DAn has the same configuration. Between collectors of the transistors Q11 to Q1n, Q21 to Q2n and the power source voltage Vcc, the load resistors Rc1, Rc2 are respectively connected in common.

Output currents Ic11 to Ic1n, and Ic21 to Ic2n of the differential amplifiers DA1 to DAn are respectively summed to each other by the load resistors Rc1, Rc2, and are produced as an output voltage Vout2 between output terminals T1 and T2.

In the above configuration, a voltage V1 of the output terminal T1 and a voltage V2 of the output terminal T2 are respectively represented by the following equations (3) and (4).

$$V1 = Vcc - Rc1 \cdot (Ic11 + \ldots + Ic1n) \quad (3)$$

$$V2 = Vcc - Rc2 \cdot (Ic21 + \ldots + Ic2n) \quad (4)$$

Therefore, the output voltage Vout2 of the magnetic sensor IC 11 is shown in the following equation (5).

$$\begin{aligned} Vout2 &= V2 - V1 \\ &= Rc1 \cdot (Ic11 + \ldots + Ic1n) - \\ &\quad Rc2 \cdot (Ic21 + \ldots + Ic2n) \end{aligned} \quad (5)$$

In the first embodiment, values of the load resistors Rc1, Rc2, the current-feedback resistors $R_{E1}$ to $R_{En}$, bias currents I11 to I1n generated in the current sources J11 to J1n, and bias currents I21 to J2n generated in the current sources J21 to J2n are adjusted so that a voltage gain of each of the differential amplifiers DA1 to DAn could be a value A, where $Rc1 = Rc2$, $R_{E1} = \ldots = R_{En}$, $I_{11} = I_{21} = \ldots = I_{1n} = I_{2n}$.

In the above conditions, the output voltage Vout2 of the magnetic sensor IC 11 is given by the following equation (6).

$$\begin{aligned} Vout2 &= A \cdot (V_{HO1} + \ldots + V_{HOn}) \cdot B + \\ &\quad A \cdot ((V_{Hoff1} + \ldots + V_{Hoffn}) + \\ &\quad (V_{Aoff1} + \ldots + V_{Aoffn})) \end{aligned} \quad (6)$$

where:

A: voltage gain of the differential amplifiers DA1 to DAn, $V_{HO1}$ to $V_{HOn}$: sensitivity of the Hall sensors Hs1 to Hsn, B: magnetic flux density of a magnetic field applied to the magnetic sensor IC, $V_{Hoff1}$ to $V_{Hoffn}$: unbalanced voltages in the Hall sensors Hs1 to Hsn, and $V_{Aoff1}$ to $V_{Aoffn}$: input offset voltages of the differential amplifiers DA1 to DAn.

In the equation (6), the first term indicates a Hall output voltage component when the magnetic flux density B is applied to the magnetic sensor IC 11. The second term of the equation (6) indicates an unbalanced voltage component given by sums of the unbalanced voltages $V_{Hoff1}$ to $V_{Hoffn}$ in the Hall sensors Hs1 to Hsn and the input offset voltages $V_{Aoff1}$ to $V_{Aoffn}$ of the differential amplifiers DA1 to DAn, the sums being multiplied with the voltage gain A of the differential amplifiers DA1 to DAn.

Since the n Hall sensors Hs1 to Hsn have the same shape and are formed close to each other in the same semiconductor chip, the n Hall sensors Hs1 to Hsn may have the same physical characteristics. Therefore, sensitivity $V_{HO1}$ to $V_{HOn}$ of the Hall sensors Hs1 to Hsn may be substantially equal to each other. The above situation is represented as follows:

$$V_{HO1} = V_{HO2} = \ldots = V_{HOn} = V_{HO} \tag{7}$$

Substituting the equation (7) to the equation (6), the following equation (8) is obtained.

$$\begin{aligned} Vout2 = & \ A \cdot V_{HO} \cdot n \cdot B + \\ & A \cdot ((VH_{off1} + \ldots + V_{Hoffn}) + \\ & (V_{Aoff1} + \ldots + V_{Aoffn})) \end{aligned} \tag{8}$$

where n is the number of Hall sensors and the number of differential amplifiers.

In the equation (8), the first term indicates the Hall output voltage component when the magnetic flux density B is applied to the magnetic sensor IC 11. The following equation (9) given by dividing the first term by the magnetic flux density B indicates sensitivity K2 of the magnetic sensor IC 11.

$$K2 = A \cdot V_{HO} \cdot n \tag{9}$$

A ratio of the sensitivity of the magnetic sensor IC 11 according to the present invention indicated by the equation (9) to the sensitivity of the prior art magnetic sensor IC 21 indicated by the equation (2) is obtained by dividing the equation (9) by the equation (2) as follows:

$$A \cdot V_{HO} \cdot n / (A \cdot V_{HO}) = n \tag{10}$$

Figure 1:
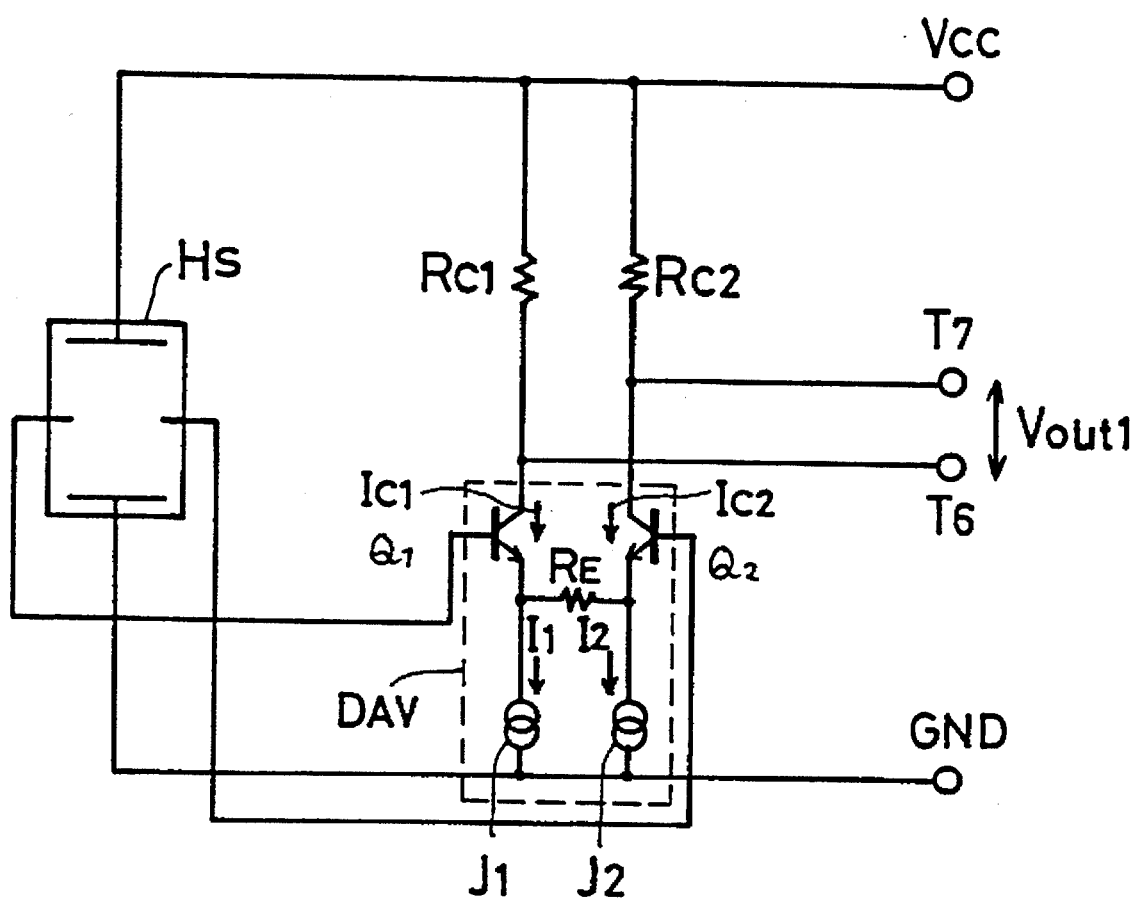
FIG. 1 shows a schematic diagram of a prior art magnetic sensor IC.

The equation (10) shows that the sensitivity of the magnetic sensor IC 11 shown in FIG. 2 is n times that of the prior art magnetic sensor IC 21 shown in FIG. 1.

In general, it is known that when devices or circuits have the same shapes in the same semiconductor chip, electrical characteristics of the devices or circuits for a large number of semiconductor chips have a normal distribution.

When a standard deviation of a population of the normally-distributed electrical characteristics is represented by $\sigma_0$ and when n devices or n circuits are connected in parallel, a standard deviation $\sigma$ of the electrical characteristics of the n devices or the n circuits is given by the following equation (11).

$$\sigma = \sigma_0 / \sqrt{n} \tag{11}$$

When the n devices or the n circuits are constructed so that their electrical characteristics are substantially averaged, the standard deviation $\sigma$ of the electrical characteristics of the devices or the circuits may also be represented by the above equation (11) in the same way that the n devices or the n circuits are connected in parallel.

In the prior art magnetic sensor IC 21 shown in FIG. 1, a single Hall sensor Hs and a single differential amplifier DAV are used. Therefore, in the population of a large number of semiconductor chips of the magnetic sensor IC 21, when a standard deviation of the unbalanced voltage $V_{Hoff}$ of the Hall sensor Hs is represented by $\sigma_{HO}$, and when a standard deviation of the input voltage $V_{Aoff}$ of the differential amplifier DAV is represented by $\sigma_{AO}$, a standard deviation $\sigma_1$ of the voltage in the unbalanced component included in the output voltage Vout1 of the magnetic sensor IC 21 is represented by the following equation (12) by using the equation (1).

$$\sigma_1 = A \cdot \sqrt{(\sigma_{HO}^2 + \sigma_{AO}^2)} \tag{12}$$

On the other hand, in the magnetic sensor IC 11 of the first embodiment, in the second term of the above-mentioned equation (8), the n unbalanced voltages $V_{Hoff1}$ to $V_{Hoffn}$ of the Hall sensors Hs1 to Hsn are summed to each other, and the n input offset voltages $V_{Aoff1}$ to $V_{Aoffn}$ of the differential amplifiers DA1 to DAn are summed to each other.

Therefore, the magnetic sensor IC 11 shown in FIG. 2 indicates configurations that the n unbalanced voltages $V_{Hoff1}$ to $V_{Hoffn}$ of the Hall sensors Hs1 to Hsn are substantially averaged, and the n input offset voltages $V_{Aoff1}$ to $V_{Aoffn}$ of the differential amplifiers DA1 to DAn are substantially averaged.

Accordingly, in the population of a large number of semiconductor chips of the magnetic sensor IC 11, when a standard deviation of each of the unbalanced voltages $V_{Hoff1}$ to $V_{Hoffn}$ of the Hall sensors Hs1 to Hsn is represented by $\sigma_{HO}$, a standard deviation $\sigma_H$ of the unbalanced voltage of the Hall sensor, in a case where the unbalanced voltage component of the Hall sensor included in the output voltage Vout2 of the magnetic sensor IC 11 is converted to the unbalanced voltage of one Hall sensor, is given by the following equation (13) using the equation (11).

$$\sigma_H = \sigma_{HO} / \sqrt{n} \tag{13}$$

In the same way, in the population of a large number of semiconductor chips of the magnetic sensor IC 11, when a standard deviation of each of the input offset voltages $V_{Aoff1}$ to $V_{Aoffn}$ of the differential amplifiers DA1 to DAn is represented by $\sigma_{AO}$, a standard deviation $\sigma_A$ of the input offset voltage, in a case where the input offset voltage component of the differential amplifier included in the output voltage Vout2 of the magnetic sensor IC 11 is converted to the input offset voltage of one differential amplifier, is given by the following equation (14) by using the equation (11).

$$\sigma_A = \sigma_{AO} / \sqrt{n} \tag{14}$$

In these cases, a standard deviation $\sigma_2$ of the voltage in the unbalanced component included in the output voltage Vout2 of the magnetic sensor IC 11 is obtained by using the equations (8), (13), and (14) as follows:

$$\sigma_2 = A \cdot \sqrt{(\sigma_{HO}^2 + \sigma_{AO}^2)} / \sqrt{n} \tag{15}$$

Dividing the equation (15) by the equation (12), the following equation (16) is obtained.

$$\sigma_2 / \sigma_1 = 1 / \sqrt{n} \tag{16}$$

In this way, the standard deviation of the voltage in the unbalanced component of the magnetic sensor IC 11 may be reduced to $1/\sqrt{n}$ that in the magnetic sensor IC 21.

A rate of the Hall output voltage component to the dispersion of the unbalanced component included in the output voltage of the magnetic sensor IC is represented by the following equation (17) for the magnetic sensor IC 21, and is represented by the following equation (18) for the magnetic sensor IC 11.

$$A \cdot V_{HO} \cdot B / \left( A \cdot \sqrt{(\sigma_{HO}^2 + \sigma_{AO}^2)} \right) \tag{17}$$

$$A \cdot V_{HO} \cdot n \cdot B / \left( A \cdot \sqrt{(\sigma_{HO}^2 + \sigma_{AO}^2)} \quad / \sqrt{n} \right) \tag{18}$$

When dividing the equation (18) by the equation (17), relative sensitivity of the magnetic sensor IC 11 of the first embodiment to the prior art magnetic sensor IC 21 is obtained, and is represented by the following equation (19).

$$K = n / \sqrt{n} \tag{19}$$

Therefore, in the magnetic sensor IC 11 which is constructed with the n Hall sensors Hs1 to Hsn and the n differential amplifiers DA1 to DAn, the sensitivity may be increased n times that of the prior art magnetic sensor IC 21 which is constructed with the single Hall sensor Hs and the single differential amplifier DAV. Further, dispersion of the output voltage in the magnetic sensor IC 11 may be reduced to $1/\sqrt{n}$ of that in the prior art magnetic sensor IC 21. Moreover, the relative sensitivity, taking the dispersion of the output voltage into account, may be represented by $n/\sqrt{n}$ as shown in the equation (19). Accordingly, a highly sensitive magnetic sensor IC may be constructed.

In this way, since the magnetic sensor IC 11 may have characteristics of high sensitivity and small dispersion of the output voltage, the sensor is usable in applications involving measuring a magnetic field with high precision.

Figure 3:
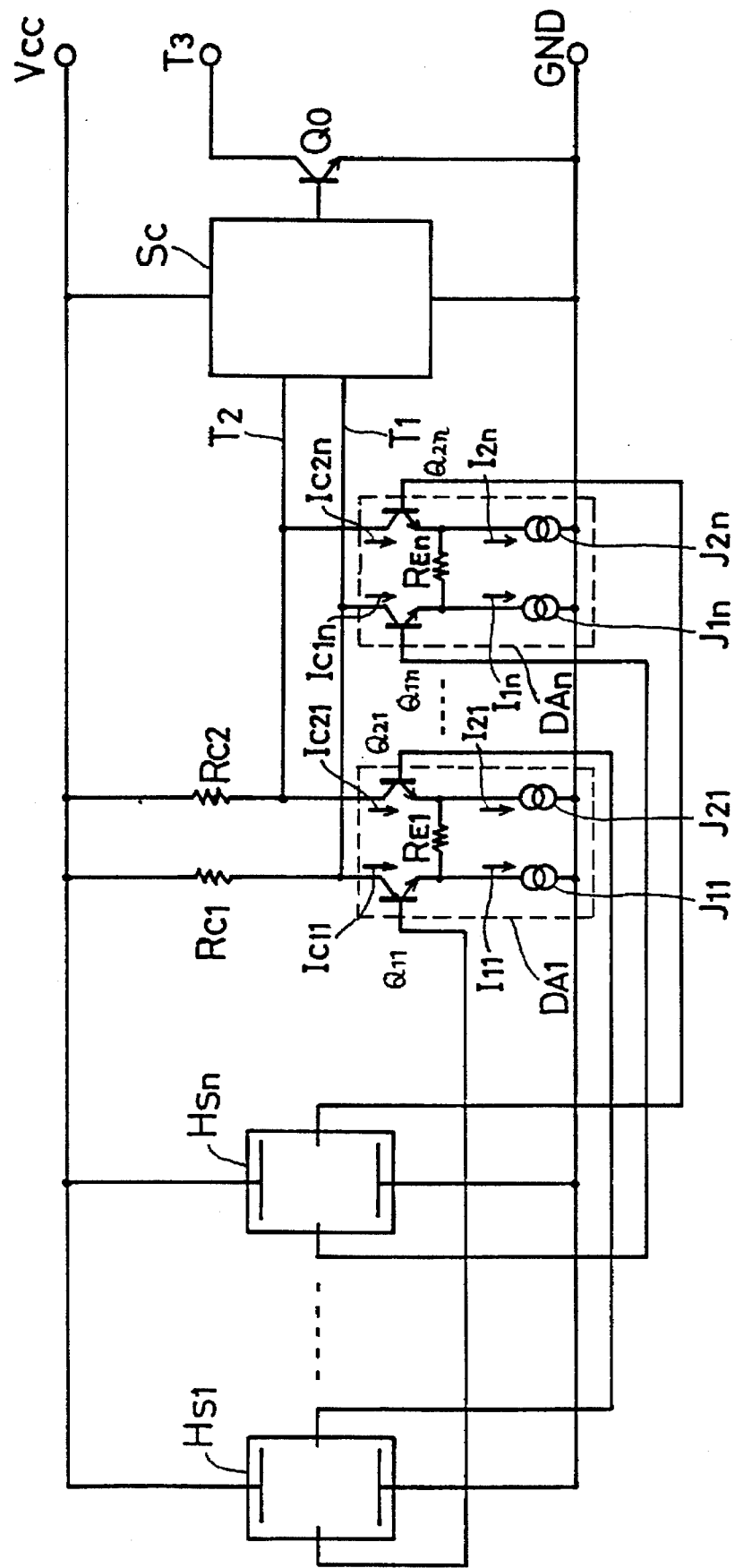
FIG. 3 shows a schematic diagram of a second embodiment of a magnetic sensor IC according to the present invention.

Next, a description will be given of a second embodiment of a magnetic sensor IC according to the present invention, by referring to FIG. 3. FIG. 3 shows a schematic diagram of the second embodiment of the magnetic sensor IC according to the present invention. Elements in FIG. 3 which are the same as those of FIG. 2 are given the same reference numerals.

A magnetic sensor IC 12 shown in FIG. 3 is constructed with n Hall sensors Hs1 to Hsn, n differential amplifiers DA1 to DAn, load resistors Rc1, Rc2 (current addition circuit), a Schmidt trigger circuit Sc, and an output transistor QO, which are formed in the same semiconductor chip.

The Schmidt trigger circuit Sc compares an output voltage Vout2 between the terminals T1 and T2 with a reference voltage, and produces a digital signal having two levels (H level and L level).

When the output voltage of the Schmidt trigger circuit Sc is at the H level, the transistor QO turns on, and when at the L level, the transistor QO turns off. At that time, from a collector (output terminal T3) of the transistor QO, an output signal of two levels, a GND level (L level) and an open level (H level), is obtained.

In this configuration, in the magnetic sensor IC 12, when the magnetic flux density B of the magnetic field to be tested is larger than a threshold value, for example, an H-level output signal is produced.

In the magnetic sensor IC 12, in the same way as the previously-discussed magnetic sensor IC 11, dispersion of the unbalanced component causing dispersion of the output voltage Vout2 between the terminals T1 and T2 may be reduced. Therefore, in the magnetic sensor IC 12, sensitivity may be increased, and precision of the threshold for the magnetic flux density B may also be increased. Accordingly, the magnetic sensor IC 12 is usable for applications involving high precision measurement of a magnetic field.

Figure 4:
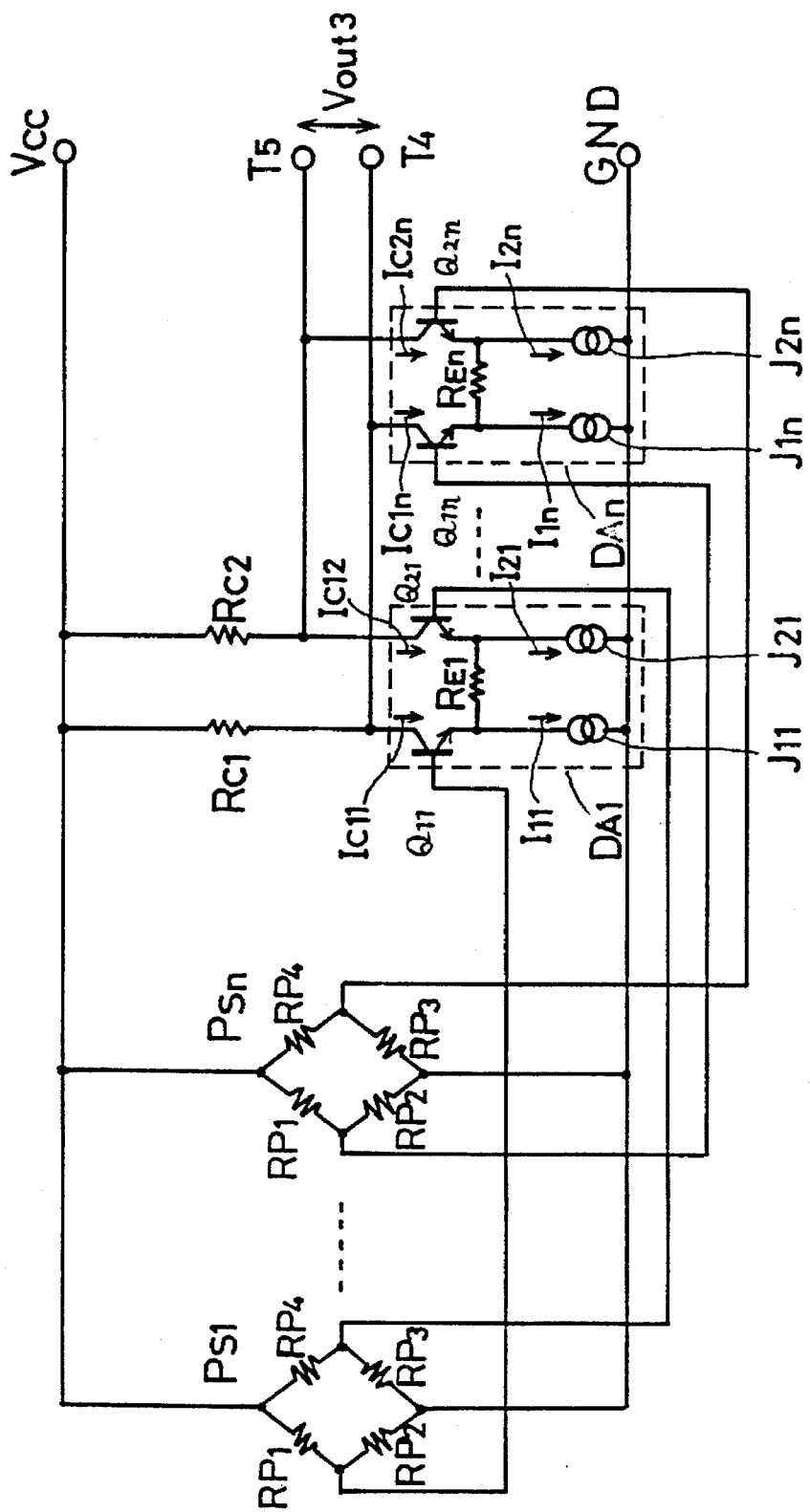
FIG. 4 shows a schematic diagram of a third embodiment of a pressure sensor IC according to the present invention.

Next, a description will be given of a third embodiment of a pressure sensor IC according to the present invention, by referring to FIG. 4. FIG. 4 shows a schematic diagram of the third embodiment of the pressure sensor IC according to the present invention. Elements in FIG. 4 which are the same as those of FIG. 2 are given the same reference numerals.

A pressure sensor IC 13 shown in FIG. 4 is constructed with n gage resistor elements (semiconductor pressure sensors) Ps1 to Psn, n differential amplifiers DA1 to DAn, and load resistors Rc1, Rc2 (current addition circuit), which are formed in the same semiconductor chip. The pressure sensor IC 13 may be formed by using, for example, the silicon-bipolar process.

In the pressure sensor IC 13, the gage resistor elements Ps1 to Psn are provided instead of the Hall sensors Hs1 to Hsn of the magnetic sensor IC 11 shown in FIG. 2.

In the semiconductor chip of the pressure sensor IC 13, the n gage resistor elements Ps1 to Psn having the same shape are formed close, i.e., adjacent, to each other, the n differential amplifiers DA1 to DAn having the same pattern and the same circuit are formed close, i.e., adjacent, to each other, and the load resistors Rc1, Rc2 having the same shape and the same value are formed close, i.e., adjacent, to each other. Between collectors of the transistors Q11 to Q1n, Q21 to Q2n and the power source voltage Vcc, the load resistors Rc1, Rc2 are respectively connected in common.

The gage resistor elements Ps1 to Psn are constructed by using the piezo resistance effect of a silicon crystal, and form a bridge circuit of diffusion resistors $R_{P1}$ to $R_{P4}$ on a silicon diaphragm. Between output terminals of the gage resistor elements Ps1 to Psn, a detected voltage is generated in proportion to an applied pressure.

In the pressure sensor IC 13, sensor output voltages produced from the gage resistor elements Ps1 to Psn are respectively given by sums of the detected voltages $V_{PO1} \cdot P$ to $V_{POn} \cdot P$ in proportion to the applied pressure and the unbalanced voltages $V_{Poff1}$ to $V_{Poffn}$ in the gage resistors elements Ps1 to Psn, where symbols $V_{PO1}$ to $V_{POn1}$ represent sensitivity of the gage resistor elements Ps1 to Psn, and a symbol P is the applied pressure.

The sensor output voltages of the gage resistor elements Ps1 to Psn are respectively provided to input terminals of the corresponding differential amplifiers DA1 to DAn. Output currents Ic11 to Ic1n, and Ic21 to Ic2n of the differential amplifiers DA1 to DAn are respectively summed to each other by the load resistors Rc1, Rc2, and are produced as an output voltage Vout3 between output terminals T4 and T5.

In the above configuration, a voltage V4 of the output terminal T4 and a voltage V5 of the output terminal T5 are respectively represented by the following equations (20) and (21).

$$V4 = Vcc - Rc1 \cdot (Ic11 + \ldots + Ic1n) \tag{20}$$

$$V5 = Vcc - Rc2 \cdot (Ic21 + \ldots + Ic2n) \tag{21}$$

Therefore, the output voltage Vout3 of the pressure sensor IC 13 is represented by the following equation (22).

$$\begin{aligned} Vout3 &= V5 - V4 \\ &= Rc1 \cdot (Ic11 + \ldots + Ic1n) - \\ & \quad Rc2 \cdot (Ic21 + \ldots + Ic2n) \end{aligned} \tag{22}$$

In this embodiment, values of the load resistors Rc1, Rc2, the current-feedback resistors $R_{E1}$ to $R_{En}$, bias currents I11 to I1n generated in the current sources J11 to J1n, and bias currents I21 to J2n generated in the current sources J21 to J2n are adjusted so that a voltage gain of each of the differential amplifiers DA1 to DAn could be a value A, where Rc1=Rc2, $R_{E1}=..=R_{En}$, $I_{11}=I_{21}=..=I_{1n}=I_{2n}$.

In the above conditions, the output voltage Vout3 of the pressure sensor IC 13 is given by the following equation (23).

$$Vout3 = A \cdot V_{PO} \cdot n \cdot P + \qquad (23)$$
$$A \cdot ((V_{Poff1} + \ldots + V_{Poffn}) +$$
$$(V_{Aoff1} + \ldots + V_{Aoffn}))$$

where $V_{PO}=V_{PO1}\approx V_{PO2}\approx .\approx V_{POn}$,

A: voltage gain of the differential amplifiers DA1 to DAn, $V_{PO1}$ to $V_{POn}$: sensitivity of the gage resistor elements Ps1 to Psn, P: pressure applied to the pressure IC, $V_{Ppoff1}$ to $V_{Poffn}$: unbalanced voltages in the gage resistor elements Ps1 to Psn, and $V_{Aoff1}$ to $V_{Aoffn}$: input offset voltages of the differential amplifiers DA1 to DAn.

The equation (23) is substantially the same as the equation (8) for the first embodiment.

In the same way as the magnetic sensor IC 11 of the first embodiment, the pressure sensor IC 13 shown in FIG. 4 indicates a configuration in which the n unbalances voltages $V_{Poff1}$ to $V_{Poffn}$ of the gage resistor elements Ps1 to Psn are substantially averaged, and the n input offset voltages $V_{Aoff1}$ to $V_{Aoffn}$ of the differential amplifiers DA1 to DAn are substantially averaged.

Therefore, in a population of a large number of semiconductor chips of the pressure sensor IC 13, when a standard deviation of each of the unbalanced voltages $V_{Poff1}$ to $V_{Poffn}$ of the gage resistor elements Ps1 to Psn are represented by $\sigma_{PO}$, a standard deviation $\sigma_P$ of the unbalanced voltage of the gage resistor element, in a case where the unbalanced voltage component of the gage resistor element included in the output voltage Vout3 of the pressure sensor IC 13 is converted to the unbalanced voltage of one gage resistor element, is given by the following equation (24) using the equation (11).

$$\sigma_P = \sigma_{PO}/\sqrt{n} \qquad (24)$$

In the same way, in the population of a large number of semiconductor chips of the pressure sensor IC 13, when a standard deviation of each of the input offset voltages $V_{Aoff1}$ to $V_{Aoffn}$ of the differential amplifiers DA1 to DAn are represented by $\sigma_{AO}$, a standard deviation $\sigma_A$ of the input offset voltage, in a case where the input offset voltage component of the differential amplifier included in the output voltage Vout3 of the pressure sensor IC 13 is converted to the input offset voltage of one differential amplifier, is given by the following equation (25) by using the equation (11).

$$\sigma_A = \sigma_{AO}/\sqrt{n} \qquad (25)$$

In these cases, a standard deviation $\sigma_3$ of the voltage in the unbalanced component included in the output voltage Vout3 of the pressure sensor IC 13 is obtained by using the equations (23), (24), and (25) as follows:

$$\sigma_3 = A \cdot \sqrt{(\sigma_{PO}^2 + \sigma_{AO}^2)} \ /\sqrt{n} \qquad (26)$$

Therefore, in the pressure sensor IC 13 shown in FIG. 4, which is constructed with the n gage resistor elements Ps1 to Psn and the n differential amplifiers DA1 to DAn, the sensitivity may be increased n times that of a pressure sensor IC which is constructed with a single gage resistor element and a single differential amplifier. Further, a standard deviation of the voltage in the unbalanced component causing the dispersion of the output voltage in the pressure sensor IC 13 may be reduced to $1/\sqrt{n}$ of that in the pressure sensor IC having the single gage resistor element and the single differential amplifier, as indicated in the equation (26).

Accordingly, a high-sensitive pressure sensor IC with small dispersion of the output voltage may be constructed.

In this way, since the pressure sensor IC 13 may have characteristics of high sensitivity and small dispersion of the output voltage, this sensor is usable for applications involving high precision measurement of pressure.

Further, the present invention is not limited to these embodiments, but other variations and modifications may be made without departing from the scope of the present invention.

What is claimed is:

1. A sensor IC generating a voltage according to magnetic flux density of an applied magnetic field, said sensor IC comprising:

a plurality of Hall sensors having an identical shape formed adjacent to each other in a semiconductor chip, each of the Hall sensors generating a sensor output voltage which includes a Hall output voltage component in proportion to said magnetic flux density;

a plurality of differential amplifiers having an identical pattern and an identical circuit formed adjacent to each other in said semiconductor chip, each of the differential amplifiers multiplying said sensor output voltage produced from a corresponding one of the Hall sensors by a given gain; and a summing circuit summing output signals produced from said plurality of differential amplifiers, said summing circuit having at least two load resisters having an identical shape and an identical value formed adjacent to each other in said semiconductor chip, each of said load resisters being connected to said plurality of differential amplifiers in common so as to provide summing of output current of the plurality of differential amplifiers.

2. The sensor IC as claimed in claim 1, wherein said sensor IC further comprises a waveform-shaping circuit comparing an output voltage of said summing circuit with a reference voltage and converting said output signal of the summing circuit to a digital signal having two levels.

3. A sensor IC generating a voltage according to applied pressure, said sensor IC comprising:

a plurality of semiconductor pressure sensors having an identical shape formed adjacent to each other in a semiconductor chip, each of the sensors generating a sensor output voltage which includes a detected voltage component in proportion to said applied pressure;

a plurality of differential amplifiers having an identical pattern and an identical circuit formed adjacent to each other in said semiconductor chip, each of the differential amplifiers multiplying said sensor output voltage produced from a corresponding one of the semiconductor pressure sensors by a given gain; and a summing circuit summing output signals produced from said plurality of differential amplifiers, said summing circuit having at least two load resistors having an identical shape and an identical value formed adjacent to each other in said semiconductor chip, each of said load resistors being connected to said plurality of differential amplifiers in common so as to provide summing of output current of the plurality of differential amplifiers.

* * * * *